United States Patent [19]

Mouri

[11] 4,400,633

[45] Aug. 23, 1983

[54] LEVEL DETECTION CIRCUIT

[75] Inventor: Tomohiro Mouri, Musashino, Japan

[73] Assignee: Victor Company of Japan Ltd., Kanagawa, Japan

[21] Appl. No.: 193,523

[22] Filed: Oct. 2, 1980

[30] Foreign Application Priority Data

Oct. 3, 1979 [JP] Japan ................................. 54-127730

[51] Int. Cl.³ ...................... G01R 19/04; G01R 19/30
[52] U.S. Cl. ................................... 307/351; 307/353;
328/151
[58] Field of Search ............................. 307/350–354,
307/600, 603, 608; 328/151

[56] References Cited

U.S. PATENT DOCUMENTS

| | | | |
|---|---|---|---|
| 3,178,595 | 4/1965 | Cole | 307/350 |
| 3,286,200 | 11/1966 | Foulger | 307/351 |
| 3,364,365 | 1/1968 | Eisenhauer | 307/350 |
| 3,828,260 | 8/1974 | Underwood | 307/351 |

FOREIGN PATENT DOCUMENTS 1766812 3/1971 Fed. Rep. of Germany .
2937861 4/1981 Fed. Rep. of Germany .

Primary Examiner—John Zazworsky
Attorney, Agent, or Firm—Posnack, Roberts, Cohen & Spiecens

[57] ABSTRACT

A level detection circuit comprises a peak value detection and holding circuit having a capacitor which detects and holds the peak value of an input signal by charging the capacitor, an operation control circuit for supplying the input signal to the maximum value detection and holding circuit during a specific time interval to perform maximum value detection and holding operation, a discharge circuit which performs constant current discharge of a charged electric charge in the capacitor of the maximum value detection and holding circuit after the specific time interval, and a detection circuit for detecting the level of the input signal by measuring the time interval between a time point the constant current discharge of the capacitor by the discharge circuit is initiated and a time point the terminal voltage of the capacitor reaches a specific voltage.

5 Claims, 2 Drawing Figures

U.S. Patent     Aug. 23, 1983     4,400,633
FIG. 1
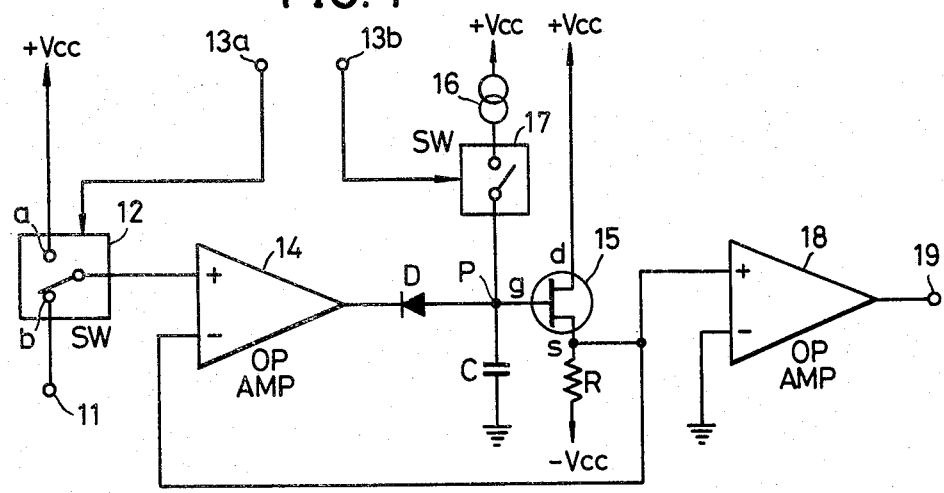
FIG. 2A
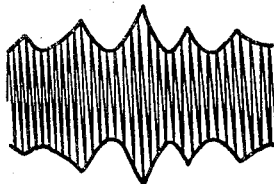
FIG. 2B
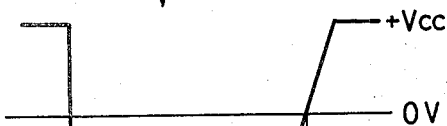
FIG. 2C
FIG. 2D
FIG. 2E
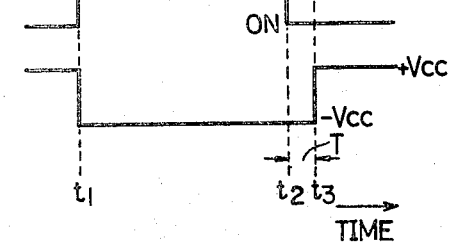

LEVEL DETECTION CIRCUIT

BACKGROUND OF THE INVENTION

The present invention relates generally to level detection circuits, and more particularly to a level detection circuit which holds the maximum peak value of an input signal and accordingly detects the maximum value of the level of the input signal.

Recently, in cassette type tape recorders, a circuit is known which automatically adjusts and establishes the most suitable recording bias current, recording equalizer characteristic, recording and/or reproducing sensitivity, and the like, according to the kind of tape used by employing a micro-computer or the like to perform the measurements, as disclosed in U.S. Pat. Nos. 4,220,979, 4,258,397, and 4,279,005, for example. When effecting this type of an automatic measurement, there is a need to record a specific signal on a part of the tape, and reproducing this signal to detect the level. Therefore, it is necessary to employ a level detection circuit which is capable of accurately detecting the signal level.

The conventional level detection circuit which employs a micro-computer to detect the level was organized so that an input signal is applied to the integrating circuit to perform an integration operation by charging a capacitor in the integrating circuit during a specific time controlled by the micro-computer, the charged electric charge in the above capacitor is discharged after the above specific charging time is elapsed, and the discharging interval during the voltage of the capacitor reaches a specific voltage (for example, zero volts) is measured by the micro-computer, to detect the input signal level by using the above time.

However, when the contact between the magnetic tape and the magnetic head is instable due to instability of the magnetic tape travelling in the tape recorder, fluctuation is introduced in the reproduced signal level. Therefore, the integrated voltage varied due to the fluctuation in the signal level, and suffered a disadvantage in that accurate level detection could not be performed. Furthermore, upon partial drop-out of the reproduced signal, the integrated voltage varied, and also suffered a disadvantage in that accurate level detection could not be performed.

Hence, the inventor of the present invention perceived on the point that the level fluctuation of the reproduced signal in the tape recorder is generated symmetrically up-and-down as in the regular amplitude modulation, and that even upon the above fluctuation in the reproduced signal level, its maximum value is substantially equal to the maximum value of the reproduced signal upon normal contact between the magnetic tape and head, and level upon level fluctuation in other parts is lower than the normal reproduced signal level. Accordingly, in the conventional circuits, the whole reproduced signal level was integrated, thus not being able to perform accurate level detection. However, in the present invention, instead of measuring the fluctuating reproduced signal level, only a maximum level portion which occurs during a specific period of time is measured selectively.

SUMMARY OF THE INVENTION

Accordingly, it is a general object of the present invention to provide a novel and useful level detection circuit.

Another and specific object of the invention is to provide a level detection circuit which detects the signal level by holding the peak value of the input signal in a capacitor for a specific period of time, afterwards discharging the charged electric charge in the capacitor, and measuring the discharging time by use of a micro-computer.

Other objects and further features of the invention will be apparent from the following detailed description when read in conjunction with the accompanying drawings.

BRIEF DESCRIPTION OF THE DRAWINGS

FIG. 1 is a circuit diagram of one embodiment of a level detection circuit of the present invention; and FIGS. 2(A) through 2(E) are respectively graphs showing the signal waveforms at respective parts of the circuit of FIG. 1.

DETAILED DESCRIPTION

In FIG. 1, the reproduced signal from the magnetic tape in the tape recorder, is applied to an input terminal 11 as an input signal. An electronic switching circuit 12 is shown for explanation as a type in which a movable contact changes over between fixed contact points a and b. The contact point a is connected to a direct current (DC) voltage source of a positive voltage +Vcc, and the contact point b is connected to the input terminal 11. The switch of the electronic switching circuit 12 is connected to a non-inverting input terminal of an operational amplifier 14.

The output side of the operational amplifier 14 is connected to a gate g of a field-effect-transistor (FET) 15 through a diode D connected with its polarity reversed. A capacitor C for charging and discharging is connected between the ground and a connection point P between the diode D and gate g of the FET 15. A constant current source 16 and an electronic switching circuit 17 are connected between the connection point P and the DC voltage source of the voltage +Vcc. The electronic switching circuit 17 is shown for explanation as an opening-and-closing switch.

The electronic switching circuits 12 and 17 are respectively controlled by control signals supplied from a micro-computer (not shown) through terminals 13a and 13b.

A drain terminal d of the FET 15 is connected to the DC voltage source of the voltage +Vcc, and a source s is connected to the DC voltage source of the negative voltage −Vcc through a resistor R. Furthermore, the source terminal s of the FET 15 is connected to an inverting input terminal of the operational amplifier 14 and also to a non-inverting input terminal of an operational amplifier 18. An inverting input terminal of the operational amplifier 18 is grounded.

Here, the operational amplifier 14, diode D, capacitor C, FET 15, and resistor R constitute a circuit which detects and holds the peak value of the reverse polarity characteristic. In addition, the operational amplifier 18 operates as a so-called zero-cross detector.

In the electronic switching circuit 12, the switch is changed over and connected to the contact b side at a time point $t_1$, as shown in FIG. 2(C) in response to a first control signal from the micro-computer applied through the terminal 13a. Accordingly, the input signal (the reproduced signal from the magnetic tape in the tape recorder) of the waveform shown in FIG. 2(A) applied to the input terminal 11, is supplied to the non-inverting input terminal of the operational amplifier 14 through the electronic switching circuit 12 beyond the time point $t_1$. The above input signal is usually a sinusoidal wave with constant peak level, however, in FIG. 2(A), the input signal is shown as having unstable movement of the magnetic tape, and level variation.

The electronic switching circuit 17 is turned off at the time point $t_1$ as shown in FIG. 2(D), by the first control signal from the micro-computer applied through the terminal 13b. The connection of the switch to the contact b side within the electronic switching circuit 12, and the OFF state of the electronic switching circuit 17 is maintained until a time point $t_2$. The time interval between the time points $t_1$ and $t_2$ is predetermined to a constant time interval (for example, 40 msec) in which time interval the maximum value of the input signal will appear beyond the time point $t_1$.

The FET 15 is a type which becomes non-conductive when the electronic switching circuit 17 is in an OFF state (between the time points $t_1$ and $t_2$), and the signal which has undergone reverse polarity wave detection, of the output signals of the operational amplifier 14 which has passed through the diode D, is charged in the capacitor C. The terminal voltage of the capacitor C is obtained from the FET 15 of a source-follower, and then applied to the inverting terminal of the operational amplifier 14. As a result, the reverse polarity peak value of the input signal is held in the capacitor C, during the time interval between the time points $t_1$ and $t_2$. The waveform of the source output of the FET 15 is shown in FIG. 2(B).

The source output signal of the FET 15 is compared with the ground level at the operational amplifier 18. During the time interval between the time points $t_1$ and $t_2$, the source output of the FET 15 is negative, and thus the output signal obtained from the operational amplifier 18 through an output terminal 19 is of a negative saturated value $-Vcc$, as shown in FIG. 2(E).

Furthermore, even when the contact between the magnetic tape and magnetic head is unstable and there exist fluctuation in the input signal as shown in FIG. 2(A), the capacitor C keeps holding the peak value by the above constructed peak holding circuit, and the terminal voltage of the capacitor C obtained from the source terminal of the FET 15 is always a voltage corresponding to the maximum value of the input signal level to that particular point in time, as shown in FIG. 2(B). Accordingly, the maximum peak value of the input signal can constantly be detected, without being effected by the above level fluctuation.

Next, at a time point $t_2$ after a specific time lapse from the time point $t_1$, the switch of the electronic switching circuit 12 is changed over to the contact a side as shown in FIG. 2(C), in response to a second control signal applied from the micro-computer through the terminal 13a. Therefore, the supply of the input signal to the operational amplifier 14 is interrupted, and a positive voltage $+Vcc$ of the DC voltage source is applied to the non-inverting terminal of the operational amplifier 14 through the electronic switching circuit 12. Hence, the diode D is turned OFF, and the input signal peak value detection operation is stopped.

At the time point $t_2$, the electronic switching circuit 17 becomes ON as shown in FIG. 2(D), by the second control signal applied from the micro-computer through the terminal 13b. Therefore, the constant current from the constant current source 16 flows through the capacitor C through the electronic switching circuit 17, and the charged electric charge in the capacitor C is discharged under constant current discharge.

By the constant current discharge of the capacitor C after the time point $t_2$, the terminal voltage of the capacitor C rises, and the output voltage of the source terminal of the FET 15 also rises as shown in FIG. 2(B). The output voltage of the source terminal of the FET 15 is constantly applied to the non-inverting terminal of the operational amplifier 18.

The operational amplifier 18 having its inverting terminal grounded operates as a zero-cross detector, and the moment (a time point $t_3$) the output voltage of the source terminal of the FET 15 rises above the ground level (zero volt), the output signal of the operational amplifier 18 reverses to a positive saturated voltage $+Vcc$, as shown in FIG. 2(E). The output signal of the above operational amplifier 18 is supplied to the micro-computer from the output terminal 19. Thus, the micro-computer measures a time interval T between the time points $t_2$ and $t_3$.

The time interval T for the terminal voltage of the capacitor C to reach a specific voltage (ground level in this case), from the constant current discharge starting time point $t_2$ to the time point $t_3$ to reach the specific voltage, is proportional to the negative peak value charged in the capacitor C. Accordingly, since the constant current value of the constant current source 16 and the capacitance value of the capacitor C are previously known, by measuring the time interval T by the above micro-computer, the maximum peak value of the input signal between the time points $t_1$ and $t_2$ can be accurately measured and detected.

The detection circuit according to the present invention applied to a bias current establishing apparatus of a tape recorder, for example, will be briefly described. Preceding the recording of the audio signal on the magnetic tape, the medium frequency range signal and high frequency range signal within the audible frequency domain, are mutually recorded every time period slightly longer than that between the time points $t_1$ and $t_3$, by successively varying the bias current. This signal is then reproduced, by detecting the respective levels of the medium frequency range signal and high frequency range signal during reproduction, and a bias current recorded so that the level of the two become identical is established by use of the micro-computer. Upon the above level detection, relatively high accuracy is demanded, and thus the detection circuit of the present invention is most suitable for this type of detection. In addition, the detection circuit of the present invention cannot only be applied for level detection upon establishing of the recording bias current, but can also be applied for level detection upon adjusting and setting of the recording equalizer, upon recording and/or reproducing sensitivity, and the like.

Further, this invention is not limited to these embodiments but various variations and modifications may be made without departing from the scope of the invention.

What is claimed is:

1. A level detection circuit comprising:
   a peak value detection and holding circuit having a single capacitor and a diode, for detecting and holding the peak value of an input signal by charging said capacitor;
   operation control means for supplying said input signal to said peak value detection and holding circuit during a specific time interval to perform maximum peak value detection and holding operation, said maximum peak value occurring during said specific time interval;

a discharge circuit for performing constant current discharge of the charge in said capacitor of said peak value detection and holding circuit, said discharge being initiated at a time point after said specific time interval; and means for providing an indication of a time point when the terminal voltage of said capacitor during discharge reaches a specific voltage whereby the level of said input signal can be determined by the value of the time interval between the time point when the constant current discharge of said capacitor is initiated and the time point when the terminal voltage of the capacitor reaches said specified voltage.

2. A level detection circuit as described in claim 1 in which said peak value detection and holding circuit comprises an operational amplifier supplied with said input signal to its non-inverting terminal, said diode connected in reverse polarity to an output side of said operational amplifier, a transistor element connected to said diode and having its output side connected to an inverting terminal of said operational amplifier, and said capacitor connected between ground and a connection point between said diode and said transistor element.

3. A level detection circuit as described in claim 2, in which said discharge circuit comprises a constant current source connected between a positive voltage terminal of a voltage source and the connection point between said diode and said transistor element, and a first switching circuit connected in series with said constant current source, said first switching circuit being open for a said specific time interval and closed after lapse of said specific time interval.

4. A level detection circuit as described in claim 3 in which said operation control means comprises a second switching circuit connected to the non-inverting input terminal of said operational amplifier, and means for opening said first switching circuit for said specific time interval and controlling said second switching circuit so that said input signal is led to said operational amplifier.

5. A level detection circuit as described in claim 2 in which said detection means comprises a second operational amplifier having its non-inverting input terminal connected to the output side of said transistor element, its inverting input terminal connected to ground, said second operational amplifier reversing the output polarity when the applied voltage to said non-inverting input terminal reaches ground level.

* * * * *